US008975664B2

(12) United States Patent
Saunier et al.

(10) Patent No.: US 8,975,664 B2
(45) Date of Patent: Mar. 10, 2015

(54) GROUP III-NITRIDE TRANSISTOR USING A REGROWN STRUCTURE (75) Inventors: Paul A. Saunier, Dallas, TX (US); Edward A. Beam, III, Plano, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 13/535,127

(22) Filed: Jun. 27, 2012

(65) Prior Publication Data

US 2014/0001478 A1      Jan. 2, 2014

(51) Int. Cl.
*H01L 29/778*        (2006.01)

(52) U.S. Cl.
USPC ...... 257/194; 257/20; 257/E29.246; 438/167; 438/172

(58) Field of Classification Search
CPC .................................. H01L 29/778–29/7789
USPC ................... 257/194; 438/167, 172
See application file for complete search history.

(56) References Cited

U.S. PATENT DOCUMENTS

| 7,304,331 | B2* | 12/2007 | Saito et al. | 257/192 |
|---|---|---|---|---|
| 7,629,632 | B2* | 12/2009 | Twynam | 257/260 |
| 7,939,391 | B2* | 5/2011 | Suh et al. | 438/172 |
| 8,564,022 | B2* | 10/2013 | Lee | 257/194 |
| 8,569,769 | B2* | 10/2013 | Hwang et al. | 257/76 |
| 8,748,244 | B1* | 6/2014 | Corrion et al. | 438/169 |
| 2006/0011915 | A1 | 1/2006 | Saito et al. | |
| 2008/0237605 | A1 | 10/2008 | Murata | |
| 2008/0296618 | A1* | 12/2008 | Suh et al. | 257/190 |
| 2009/0072240 | A1 | 3/2009 | Suh et al. | |
| 2009/0072269 | A1* | 3/2009 | Suh et al. | 257/136 |
| 2010/0072516 | A1* | 3/2010 | Tamura et al. | 257/192 |
| 2010/0140664 | A1 | 6/2010 | Sheppard | |
| 2010/0259321 | A1 | 10/2010 | Tserng | |
| 2010/0327322 | A1 | 12/2010 | Kub | |
| 2011/0215424 | A1* | 9/2011 | Sato | 257/409 |
| 2011/0241020 | A1 | 10/2011 | Saunier | |
| 2012/0112202 | A1* | 5/2012 | Hwang et al. | 257/76 |

(Continued)

FOREIGN PATENT DOCUMENTS

EP            0812468 B1      6/1996

OTHER PUBLICATIONS

Nepal et al. "Temperature and compositional dependence of the energy band gap of AlGaN alloys." Appl. Phys. Lett. 87, 242104 (2005).*

(Continued)

*Primary Examiner* — Cheung Lee
*Assistant Examiner* — Stephen Bradley
(74) *Attorney, Agent, or Firm* — Schwabe Williamson & Wyatt (57) ABSTRACT

Embodiments of the present disclosure describe apparatuses, methods, and systems of an integrated circuit (IC) device. The IC device may include a buffer layer disposed on a substrate, the buffer layer including gallium (Ga) and nitrogen (N), a barrier layer disposed on the buffer layer, the barrier layer including aluminum (Al) and nitrogen (N), a regrown structure disposed in and epitaxially coupled with the barrier layer, the regrown structure including nitrogen (N) and at least one of aluminum (Al) or gallium (Ga) and being epitaxially deposited at a temperature less than or equal to 600° C., and a gate terminal disposed in the barrier layer, wherein the regrown structure is disposed between the gate terminal and the buffer layer. Other embodiments may be described and/or claimed.

17 Claims, 6 Drawing Sheets

(56) References Cited

U.S. PATENT DOCUMENTS

2012/0235160 A1* 9/2012 Heikman et al. .......... 257/76
2013/0292698 A1 11/2013 Then et al.

OTHER PUBLICATIONS

Non-Final Office Action in U.S. Appl. No. 13/278,084 dated Dec. 6, 2012.
Alomari et al., "InAlN/GaN MOSHEMT with Self-Aligned Thermally Generated Oxide Recess." IEEE. vol. 30. No. 11. Nov. 2009.
Eickelkamp et al., "Electrical Properties of Thermally Oxidized AlInN/AlN/GaN-based Metal Oxide Semiconductor Hetero Field Effect Transistors." Journal of Applied Physics 110. 2011.
Kovac et al., "Schottky Barrier Height on Thermally Oxidized InAlN surface Evaluated by Electrical and Optical Measurements." Appl. Phys. Lett. 98. 2011.
U.S. Appl. No. 13/282,424, filed on Oct. 26, 2011.
U.S. Appl. No. 13/278,084, filed on Oct. 20, 2011.
U.S. Appl. No. 13/481,198, filed on May 25, 2012.
U.S. Appl. No. 13/484,215, filed on May 30, 2012.
Non-Final Office Action in U.S. Appl. No. 13/484,215 dated Jul. 31, 2014.
Non-Final Office Action in U.S. Appl. No. 13/481,198 dated Sep. 19, 2014.

* cited by examiner

FIG. 10

GROUP III-NITRIDE TRANSISTOR USING A REGROWN STRUCTURE

FIELD

Embodiments of the present disclosure generally relate to the field of integrated circuits, and more particularly, to group III-Nitride transistor using a regrown structure.

BACKGROUND

Presently, group III-Nitride-based transistors such as gallium nitride (GaN)-based high electron mobility transistors (HEMTs) are typically Depletion-mode (D-mode) devices, which use a negative gate voltage with respect to source voltage in order to pinch-off current flow in the transistor channel. However, Enhancement-mode (E-mode) devices, which use a positive gate voltage with respect to source voltage in order to pinch-off current flow, may be desirable for applications such as power switching. E-mode devices can be fabricated by controlling a thickness of a supply layer to be less than a critical thickness such that a two-dimensional electron gas (2DEG) does not form in the channel beneath the gate during operation of the transistor. However, conventional recess and deposition processes to form the E-mode device may induce traps or other defects at an interface of the gate and channel.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide techniques and configurations of a group III-Nitride transistor using a regrown structure. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed, disposed, or otherwise configured on a second layer," may mean that the first layer is formed, disposed, or otherwise configured over the second layer, and at least a part of the first layer may be in direct contact (e.g., direct physical and/or electrical contact) or indirect contact (e.g., having one or more other layers between the first layer and the second layer) with at least a part of the second layer.

Figure 1:
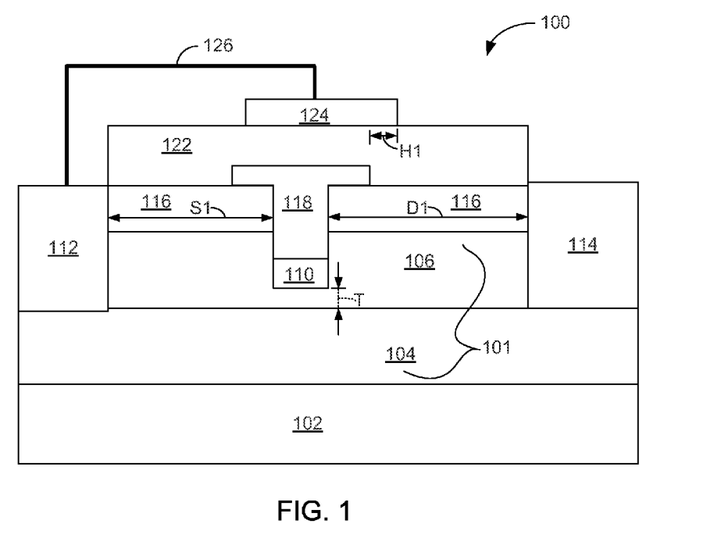
FIG. 1 schematically illustrates a cross-section view of an integrated circuit (IC) device, according to various embodiments.

FIG. 1 schematically illustrates a cross-section view of an integrated circuit (IC) device 100, according to various embodiments. The IC device 100 may be fabricated on a substrate 102. The substrate 102 generally includes a support material upon which a stack of layers (or simply "stack 101") is deposited. In an embodiment, the substrate 102 includes silicon (Si), silicon carbide (SiC), aluminum oxide ($Al_2O_3$) or "sapphire," gallium nitride (GaN), and/or aluminum nitride (AlN). Other materials including suitable group II-VI and group III-V semiconductor material systems can be used for the substrate 102 in other embodiments. In an embodiment, the substrate 102 may be composed of any material or combination of materials upon which material of the buffer layer 104 can be epitaxially grown.

The stack 101 formed on the substrate 102 may include epitaxially deposited layers of different material systems that form one or more heterojunctions/heterostructures. The layers of the stack 101 may be formed in situ. That is, the stack 101 may be formed on the substrate 102 in manufacturing equipment (e.g., a chamber) where the constituent layers of the stack 101 are formed (e.g., epitaxially grown) without removing the substrate 102 from the manufacturing equipment.

In one embodiment, the stack 101 of the IC device 100 includes a buffer layer 104 formed on the substrate 102. The buffer layer 104 may provide a crystal structure transition between the substrate 102 and other components (e.g., barrier layer 106) of the IC device 100, thereby acting as a buffer or isolation layer between the substrate 102 and other components of the IC device 100. For example, the buffer layer 104 may provide stress relaxation between the substrate 102 and other lattice-mismatched materials (e.g., the barrier layer 106). In some embodiments, the buffer layer 104 may serve as a channel for mobile charge carriers of a transistor. The buffer layer 104 may be undoped in some embodiments. The buffer layer 104 may be epitaxially coupled with the substrate 102. In other embodiments, a nucleation layer (not shown) may intervene between the substrate 102 and the buffer layer 104. The buffer layer 104 may be composed of a plurality of deposited films or layers in some embodiments.

In some embodiments, the buffer layer 104 may include a group III-nitride-based material such as, for example, gallium nitride (GaN) or aluminum nitride (AlN). The buffer layer 104 may have a thickness from 1 to 2 microns in a direction that is substantially perpendicular to a surface of the substrate 102 upon which the buffer layer 104 is formed. The buffer layer 104 may include other suitable materials and/or thicknesses in other embodiments.

The stack 101 may further include a barrier layer 106 (sometimes referred to as a "supply layer") formed on the buffer layer 104. A heterojunction may be formed between the barrier layer 106 and the buffer layer 104. The barrier layer 106 may have a bandgap energy that is greater than a bandgap energy of the buffer layer 104. The barrier layer 106 may be a wider bandgap layer that supplies mobile charge carriers and the buffer layer 104 may be a narrower bandgap layer that provides a channel or pathway for the mobile charge carriers. In some embodiments, the barrier layer 106 may have a bandgap energy that is equal to or less than a bandgap energy of a regrown structure 110.

The barrier layer 106 may be composed of any of a variety of suitable material systems such as, for example, group III-nitride-based material systems. The barrier layer 106 may include, for example, aluminum (Al), indium (In), gallium (Ga), and/or nitrogen (N). In some embodiments, the barrier layer 106 may be composed of a single layer of a single material. For example, in one embodiment, the barrier layer 106 may be composed of a single layer of aluminum gallium nitride ($Al_xGa_{1-x}N$), where x is a value from 0 to 1 that represents relative quantities of aluminum and gallium. In other embodiments, the barrier layer 106 may be composed of a plurality of deposited films or layers. For example, referring briefly to FIG. 2, an IC device 200 may include a barrier layer 106 that is composed of a first barrier layer 107 disposed on the buffer layer 104 and a second barrier layer 108 disposed on the first barrier layer 107, as can be seen. In some embodiments, the first barrier layer 107 may be composed of aluminum nitride (AlN) and the second barrier layer 108 may be composed of indium aluminum nitride (InAlN), aluminum gallium nitride (AlGaN), or indium gallium aluminum nitride (InGaAlN). The barrier layer 106 may include other materials or more layers than depicted in other embodiments. The IC device 200 may comport with embodiments described in connection with the IC device 100 of FIG. 1.

Referring again to FIG. 1, a two-dimensional electron gas (2DEG) may be formed at an interface (e.g., the heterojunction) of the buffer layer 104 and the barrier layer 106 allowing current (e.g., the mobile charge carriers) to flow between a source terminal, hereinafter source 112, and a drain terminal, hereinafter drain 114. In some embodiments, the IC device 100 may be an Enhancement-mode (E-mode) device, which uses a positive gate voltage with respect to source voltage in order to allow current flow in the IC device 100. In such embodiments, the barrier layer 106 may have a thickness, T, between a regrown structure 110 and the buffer layer 104 that is less than a critical thickness, $T_o$, for 2DEG formation (e.g., below the critical thickness $T_o$, the 2DEG may not form). For example, the thickness T may be configured to inhibit formation of the 2DEG at a gate region of the channel disposed between a gate terminal (hereinafter "gate 118") and the buffer layer 104 while allowing 2DEG formation to occur in access regions of the channel between the gate region and the source 112 and drain 114. In some embodiments, a thickness and/or aluminum content of the barrier layer 106 may be selected to ensure that all of the 2DEG in the gate region is removed for an IC device 100 that is either a Schottky gate device or a MIS gate device. In other embodiments, the IC device 100 may be a Depletion-mode (D-mode) device, which uses a negative gate voltage with respect to source voltage in order to pinch-off current flow in the IC device 100.

In some embodiments, the barrier layer 106 has a thickness T in the gate region that is less than or equal to 30 angstroms. For example, a barrier layer 106 composed of single layer of AlGaN may have a thickness T in the gate region that is less than or equal to 20 angstroms. A barrier layer 106 composed of AlN and/or InAlN may have a thickness T in the gate region that is less than or equal to 15 angstroms. In some embodiments, the barrier layer 106 may have a thickness T that is in a range of 10 angstroms to 50 angstroms. In some embodiments, the barrier layer 106 may have a thickness in a region external to the gate region ranging from 160 angstroms to 300 angstroms in a direction that is substantially perpendicular to a surface of the buffer layer 104 upon which the barrier layer 106 is formed. The barrier layer 106 may include other suitable materials and/or thicknesses in other embodiments.

According to various embodiments, the IC device 100 further includes a regrown structure 110 disposed in the barrier layer 106, as can be seen. The regrown structure 110 may be referred to as "regrown" to indicate that material of the barrier layer 106 may be removed and material of the regrown structure 110 may be deposited or regrown in the barrier layer 106. In some embodiments, the regrown structure 110 may serve as an insulating layer of the gate 118 to provide an E-mode device. The intervening barrier layer 106 (e.g., thickness T of the barrier layer 106) may protect a channel interface between the buffer layer 104 and the barrier layer 106 and allow formation of an insulating layer (e.g., the regrown structure 110) without inducing trap or other defect formation associated with conventional recess or deposition processes that may expose a channel interface as part of a gate recess/formation process.

Figure 2:
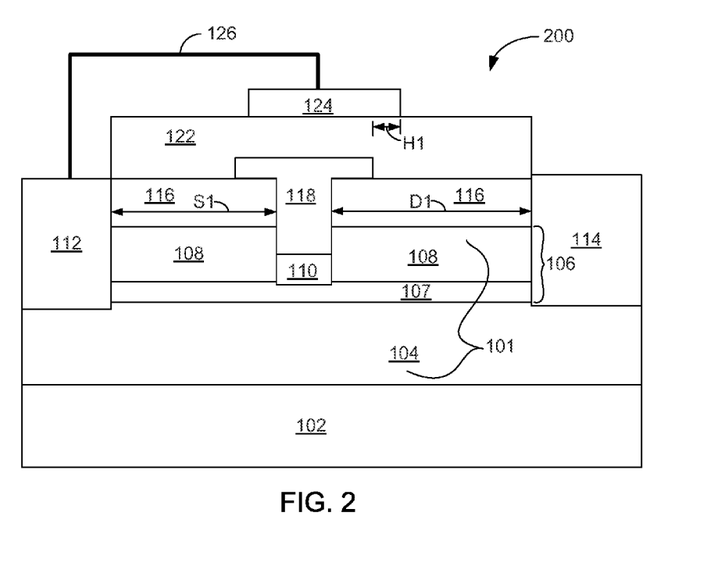
FIG. 2 schematically illustrates a cross-section view of another IC device, according to various embodiments.

In some embodiments, the regrown structure 110 is epitaxially coupled with the barrier layer 106 (e.g., first barrier layer 107 and second barrier layer 108 of FIG. 2), as can be seen. The regrown structure 110 may be disposed between the gate 118 and the buffer layer 104, as can be seen. According to various embodiments, the regrown structure 110 may have a bandgap energy that is greater than a bandgap energy of the barrier layer 106 and the buffer layer 104. In an embodiment, the regrown structure 110 may have a bandgap that is greater than or equal to 5 electron volts (eV). For example, the bandgap energy of the regrown structure 110 may range from 5 to 6 electron volts (eV). The bandgap energy of the regrown structure 110 may be greater than the bandgap energy of the barrier layer 106 and/or the buffer layer 104. In some embodiments, the regrown structure 110 may have a work function that inhibits formation of the 2DEG at the gate region disposed between the gate 118 and the buffer layer 104. The regrown structure 110 may increase sheet resistivity in the gate region (e.g., the channel) such that the regrown structure 110 is configured to pinch-off the channel of the IC device 100. For example, a wafer having an AlGaN layer may have a sheet resistivity of about 500 Ohm per square. After depositing a 100 angstrom thick layer of GaN on the AlGaN layer using the lower temperature process, the sheet resistivity may be about 1500 Ohm per square.

The regrown structure 110 may be composed of any of a variety of suitable material systems such as, for example, group III-nitride based material systems. The regrown structure 110 may include, for example, aluminum (Al), indium (In), gallium (Ga), and/or nitrogen (N). In some embodiments, the regrown structure 110 may include nitrogen (N) and at least one of aluminum (Al) or gallium (Ga). For example, the regrown structure 110 may be composed of gallium nitride (GaN), aluminum nitride (AlN), indium gallium nitride (InGaN), indium aluminum nitride (InAlN), aluminum gallium nitride (AlGaN), or indium gallium aluminum nitride (InGaAlN). In one embodiment, the regrown structure 110 is composed of GaN, the barrier layer 106 is composed of AlGaN or AlN/InAlN (e.g., first barrier layer 107 of FIG. 2 is AlN and the second barrier layer 108 of FIG. 2 is InAlN), and the buffer layer 104 is composed of GaN.

According to various embodiments, a group III-nitride may be deposited to form the regrown structure 110 using a higher temperature (HT) or a lower temperature (LT) process. The higher temperature process may include, for example, deposition of a group III-nitride such as, for example, GaN at a temperature greater than 600° C. (e.g., a range from 700° C. to 800° C.) to form a more crystalline (e.g., more like single crystal and less amorphous) structure than a structure produced by the lower temperature process. The lower temperature process may include, for example, epitaxial deposition of a group III-nitride such as, for example, GaN, at a temperature equal to or less than 600° C. to form a more amorphous or polycrystalline structure than a structure produced by the higher temperature process. For example, in one embodiment, the regrown structure 110 may include GaN deposited by epitaxial deposition at a temperature ranging between 350° C.-500° C. The higher temperature process may result in the material of the regrown structure 110 having a piezoelectric nature that makes the material more prone to incidental trap formation, which may result in increased current collapse and gate leakage in the IC device 100 if material is deposited using the higher temperature process to form the regrown structure 110. The lower temperature formation of the regrown structure 110 may result in a material having a more polycrystalline or amorphous lattice structure, thereby reducing trap formation and mitigating current collapse and gate leakage in the IC device 100. In some embodiments, the regrown structure 110 includes a substantially polycrystalline or amorphous lattice structure formed by the lower temperature process.

According to various embodiments, the regrown structure 110 may have a thickness that is less than or equal to 200 angstroms. For example, the regrown structure 110 may have a thickness that ranges from 25 angstroms to 200 angstroms in a direction that is substantially perpendicular to a surface of the buffer layer 104 upon which the barrier layer 106 is formed. Other thicknesses and types of materials can be used for the regrown structure 110 in other embodiments.

The IC device 100 may further include gate 118 disposed in barrier layer 106 (e.g., first barrier layer 107 and second barrier layer 108 of FIG. 2), as can be seen. The gate 118 may be configured to control the channel (e.g., an on/off state of the IC device 100), as can be seen. The gate 118 may serve as a connection terminal for the IC device 100 and may be in direct physical contact with the barrier layer 106 and the regrown structure 110, as can be seen. In some embodiments, the gate 118 may be formed on a dielectric layer 116 such as, for example, silicon nitride (SiN) or another dielectric material that is formed on barrier layer 106, as can be seen.

The gate 118 may have a trunk or bottom portion that is coupled with the barrier layer 106 and a top portion that extends away from the trunk portion in opposing directions that are substantially parallel to a surface of the substrate 102 upon which the stack 101 is fabricated, as can be seen. Such configuration of the trunk portion and top portion of the gate 118 may be referred to as a T-shaped field-plate gate. That is, in some embodiments, the gate 118 may have an integrated field-plate (e.g., the top portion of the gate 118), which may increase a breakdown voltage and/or reduce an electric field between the gate 118 and the drain 114. The integrated field-plate may facilitate higher voltage operation of the IC device 100.

The gate 118 may include a gate electrode (e.g., gate electrode 118a of FIG. 8) that provides an electrical pathway for a threshold voltage of the IC device 100 and a gate dielectric or gate insulator, hereinafter referred to as "gate insulator film" (e.g., gate insulator film 118b of FIG. 8), that may be disposed between the gate electrode and the barrier layer 106 and/or between the gate electrode and the regrown structure 110. The gate electrode may be composed of an electrically conductive material such as a metal. In some embodiments, the gate electrode may be composed of nickel (Ni), platinum (Pt), iridium (Ir), molybdenum (Mo), gold (Au), and/or aluminum (Al). In an embodiment, a material including Ni, Pt, Ir, or Mo is disposed in the trunk portion of the gate 118 to provide a gate contact with the barrier layer 106 and a material including Au is disposed in the top portion of the gate 118 to ensure conductivity and low resistance of the gate 118.

In various embodiments, the gate 118 may be configured to provide a Schottky junction or metal-insulator-semiconductor (MIS) junction of the IC device 100. For example, a Schottky junction may be formed when the gate insulator film is a gate dielectric or is not used at all and the MIS junction may be formed when the gate insulator film is a gate insulator. The gate dielectric may be a thinner film than the gate insulator in some embodiments. The gate insulator film may include, for example, silicon nitride (SiN), silicon oxide ($SiO_2$), aluminum oxide ($Al_2O_3$), and/or hafnium oxide ($HfO_2$). The gate insulator film may include other materials in other embodiments.

The IC device 100 may include a source 112 and drain 114 formed on the barrier layer 106. The source 112 and the drain 114 may extend through the barrier layer 106 into the buffer layer 104, as can be seen. According to various embodiments, the source 112 and the drain 114 are ohmic contacts. The source 112 and the drain 114 may be regrown contacts that may provide a relatively lower contact resistance than standard grown contacts.

The source 112 and the drain 114 may be composed of an electrically conductive material such as metal. In an embodiment, the source 112 and the drain 114 may include titanium (Ti), aluminum (Al), molybdenum (Mo), gold (Au), and/or silicon (Si). Other materials can be used in other embodiments.

In an embodiment, a distance D1 between the drain 114 and the gate 118 is greater than a distance S1 between the source 112 and the gate 118. The distance D1 may be a shortest distance between the drain 114 and the gate 118 and the distance S1 may be a shortest distance between the source 112 and the gate 118 in some embodiments. Providing a shorter distance S1 than distance D1 may increase a gate 118 to drain 114 breakdown voltage and/or reduce source 112 resistance.

A dielectric layer 122 may be formed on the gate 118 and/or the dielectric layer 116 in some embodiments, as can be seen. The dielectric layer 122 may include, for example, silicon nitride (SiN). Other materials can be used for the dielectric layer 122 in other embodiments. The dielectric layer 122 may substantially encapsulate the top portion of the gate 118. The dielectric layer 122 may serve as a passivation layer of the IC device 100 in some embodiments.

The IC device 100 may include a field-plate 124 formed on the dielectric layer 122 to increase a breakdown voltage and/or reduce an electric field between the gate 118 and the drain 114. The field-plate 124 may be electrically coupled with the source 112 using an electrically conductive material 126. The electrically conductive material 126 may include a metal such as, for example, gold (Au) that is deposited as an electrode or trace-like structure on the dielectric layer 122. Other suitable materials may be used for the electrically conductive material 126 in other embodiments.

The field-plate 124 may be composed of an electrically conductive material such as a metal and may include materials described in connection with the gate 118. The field-plate 124 may be capacitively coupled with the gate 118 through the dielectric layer 122. In some embodiments, a shortest distance between the field-plate 124 and the gate 118 ranges from 1000 angstroms to 2000 angstroms. The field-plate 124 may be formed over the gate 118 such that a portion of the field-plate 124 is not formed directly over the gate 118 to provide an overhanging region of the field-plate 124, as can be seen. In some embodiments, the overhanging region of the field-plate 124 extends beyond an edge of the top portion of the gate 118 by a distance H1. The distance H1 may be 0.2 to 1 micron in some embodiments. Other values for H1 may be used in other embodiments.

According to various embodiments, the IC device 100 may be a high electron mobility transistor (HEMT). In some embodiments, the IC device 100 may be a Schottky device. In other embodiments, the IC device 100 may be a MIS field-effect transistor (MISFET). For example, the gate 118 may be configured to control switching of an E-mode switch device in some embodiments. The IC device 100 may be used for Radio Frequency (RF), logic, and/or power conversion applications. For example, the IC device 100 may provide an effective switch device for power-switch applications including power conditioning applications such as, for example, Alternating Current (AC)-Direct Current (DC) converters, DC-DC converters, DC-AC converters, and the like.

FIGS. 3-8 depict an IC device (e.g., IC device 200 of FIG. 2) subsequent to various fabrication operations. Techniques and configurations described in connection with FIGS. 3-8 may comport with embodiments described in connection with FIGS. 1-2 and vice versa.

Figure 3:
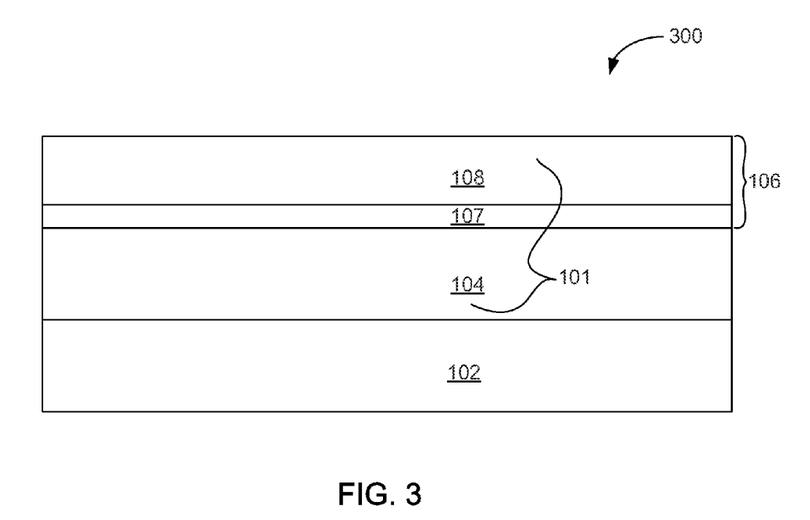
FIG. 3 schematically illustrates a cross-section view of an IC device subsequent to formation of a stack of layers on a substrate, according to various embodiments.

FIG. 3 schematically illustrates a cross-section view of an integrated circuit (IC) device 300 subsequent to formation of a stack of layers (e.g., stack 101) on a substrate 102, according to various embodiments. According to various embodiments, the IC device 300 may be fabricated by depositing a buffer layer 104 on the substrate 102, depositing a barrier layer 106 on the buffer layer 104. The barrier layer 106 may include a first barrier layer 107 deposited on the buffer layer 104 and a second barrier layer 108 deposited on the first barrier layer 107. In some embodiments, the layers of the stack 101 are deposited using an epitaxial deposition process such as, for example, molecular beam epitaxy (MBE), atomic layer epitaxy (ALE), chemical beam epitaxy (CBE) and/or metal-organic chemical vapor deposition (MOCVD). Other deposition processes may be used in other embodiments.

Figure 4:
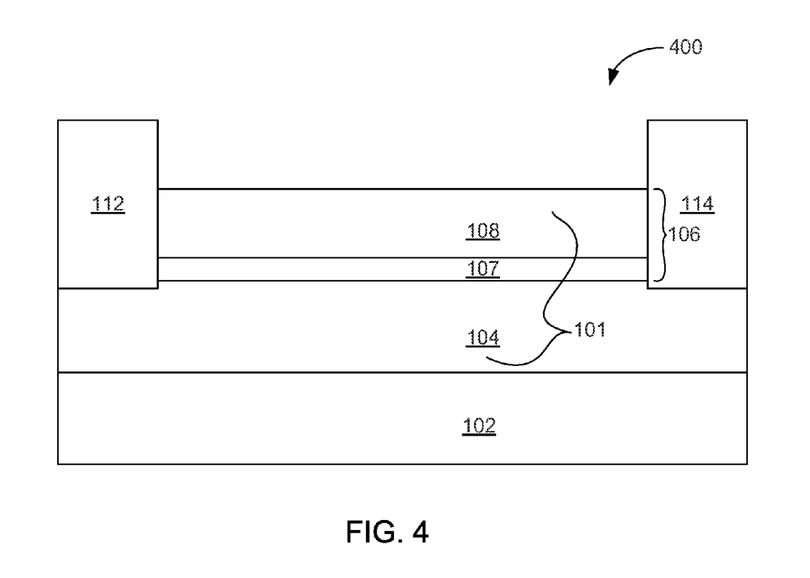
FIG. 4 schematically illustrates a cross-section view of an IC device subsequent to formation of a source and drain, according to various embodiments.

FIG. 4 schematically illustrates a cross-section view of an integrated circuit (IC) device 400 subsequent to formation of a source 112 and drain 114, according to various embodiments. The source 112 and drain 114 may be formed on the barrier layer 106 (e.g., on the second barrier layer 108) in various embodiments. In an embodiment, materials such as one or more metals are deposited on the barrier layer 106 in an area where the source 112 and drain 114 are to be formed using, e.g., an evaporation process. The materials used to form the source 112 and the drain 114 may include metals deposited in the following order: titanium (Ti) followed by aluminum (Al), which is followed by molybdenum (Mo), which is followed by titanium (Ti), which is followed by gold (Au). The deposited materials may be heated (e.g., to about 850° C. for about 30 seconds using a rapid thermal anneal process) to cause the materials to penetrate and fuse with underlying material of the barrier layer 106 (e.g., first barrier layer 107 and second barrier layer 108) and/or the buffer layer 104. In embodiments, each of the source 112 and the drain 114 extends through the barrier layer 106 and into the buffer layer 104. A thickness of the source 112 and the drain 114 may range from 1000 angstroms to 2000 angstroms. Other thicknesses for the source 112 and the drain 114 can be used in other embodiments.

The source 112 and the drain 114 may be formed by a regrowth process to provide ohmic contacts having a reduced contact resistance or reduced on-resistance. In the regrowth process, material of the barrier layer 106 and/or the buffer layer 104 is selectively removed (e.g., etched) in areas where the source 112 and the drain 114 are to be formed. A highly doped material (e.g., n++ material) may be deposited in the areas where the layers have been selectively removed. The highly doped material of the source 112 and drain 114 may be a similar material as the material used for the buffer layer 104 or barrier layer 106. For example, in a system where the buffer layer 104 includes GaN, a GaN-based material that is highly doped with silicon (Si) may be epitaxially deposited in the selectively removed areas to a thickness of 400 angstroms to 700 angstroms. The highly doped material can be epitaxially deposited by molecular beam epitaxy (MBE), atomic layer epitaxy (ALE), chemical beam epitaxy (CBE), or metal-organic chemical vapor deposition (MOCVD), or suitable combinations thereof. Other materials, thicknesses, or deposition techniques for the highly doped material can be used in other embodiments. One or more metals including, e.g., titanium (Ti) and/or gold (Au) can be formed/deposited on the highly doped material at a thickness ranging from 1000 angstroms to 1500 angstroms using, e.g., a lift-off process. Other materials, thicknesses, and/or techniques for the one or more metals can be used in other embodiments.

In some embodiments, the source 112 and the drain 114 may be formed by an implantation process that uses implantation techniques to introduce an impurity (e.g., silicon) to provide a highly doped material in the source 112 and the drain 114. After implantation, the source 112 and the drain 114 may be annealed at a high temperature (e.g., 1100° C.-1200° C.). The regrowth process may preferably avoid the high temperature associated with the post-implantation anneal.

Figure 5:
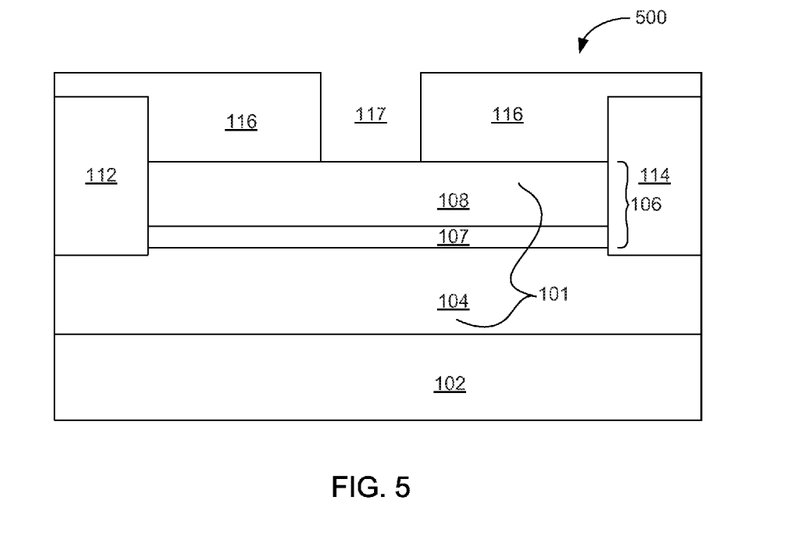
FIG. 5 schematically illustrates a cross-section view of an IC device subsequent to deposition and patterning of a dielectric layer, according to various embodiments.

FIG. 5 schematically illustrates a cross-section view of an integrated circuit (IC) device 500 subsequent to deposition and patterning of a dielectric layer 116, according to various embodiments. In some embodiments, the dielectric layer 116 may be formed by depositing a dielectric material on the barrier layer 106. The dielectric layer 116 can include, for example, silicon nitride (SiN) or any other suitable dielectric material and may be deposited using any suitable deposition process such as, for example, chemical vapor deposition (CVD), physical vapor deposition (PVD), and/or atomic layer deposition (ALD). The dielectric layer 116 may be patterned using any suitable process such as, for example, lithography and/or etch processes to form a gate recess opening 117 in the dielectric layer 116.

Figure 6:
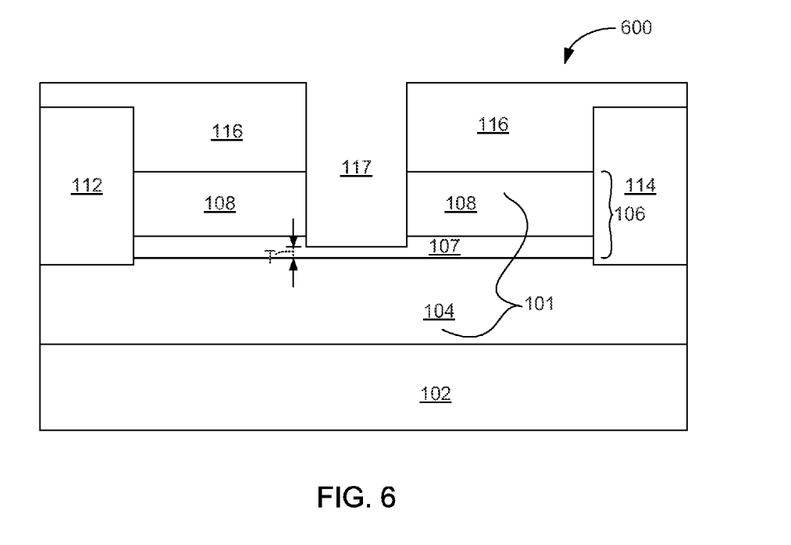
FIG. 6 schematically illustrates a cross-section view of an IC device subsequent to removal of barrier layer material, according to various embodiments.

FIG. 6 schematically illustrates a cross-section view of an integrated circuit (IC) device 600 subsequent to removal of barrier layer 106 material, according to various embodiments. According to various embodiments, material of the barrier layer 106 may be removed to form a gate recess opening 117, as can be seen. The gate recess opening 117 may be formed to allow subsequent formation of the regrown structure (e.g., regrown structure 110 of FIG. 7) in the barrier layer 106 and formation of the gate (e.g., gate insulator film 118b and gate electrode 118a of FIG. 8) in the barrier layer 106.

The material of the barrier layer 106 may be removed using any suitable process including, for example, dry/plasma or wet etch processes (e.g., timed or selective). In some embodiments, the dielectric layer 116 may serve as a hardmask during an etch process that removes material of the barrier layer 106.

In some embodiments, material of the barrier layer 106 is removed to provide a thickness T as described in connection with FIG. 1 where the thickness T may be controlled, e.g., by timed etch, selective etch, etc. In an embodiment, material of the second barrier layer 108 is removed such that a lower boundary of the gate recess opening 117 is disposed in the first barrier layer 107. That is, the gate recess opening 117 may pass completely through the second barrier layer 108. Material of the first barrier layer 107 may be removed in some embodiments, as can be seen. In some embodiments, the material of the first barrier layer 107 may be removed such that material of the buffer layer 104 is not exposed in the gate recess opening 117. In other embodiments, the gate recess opening 117 may have a lower boundary that is disposed at an upper boundary of the first barrier layer 107 without extending (e.g., beyond 5 angstroms) into the first barrier layer 107. In other embodiments, a lower boundary of the gate recess opening 117 may be disposed in the second barrier layer 108 (e.g., the gate recess opening 117 does not expose material of the first barrier layer 107).

Figure 7:
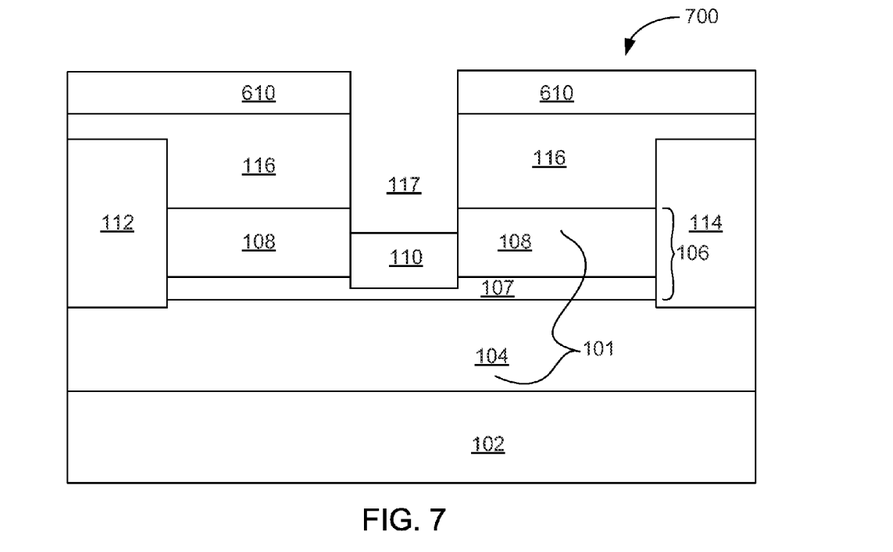
FIG. 7 schematically illustrates a cross-section view of an IC device subsequent to formation of a regrown structure, according to various embodiments.

FIG. 7 schematically illustrates a cross-section view of an integrated circuit (IC) device 700 subsequent to formation of a regrown structure 110, according to various embodiments. The regrown structure 110 may be formed by epitaxially depositing a group III-nitride into the gate recess opening (e.g., gate recess opening 117 of FIG. 6). For example, the regrown structure 110 may be deposited using molecular beam epitaxy (MBE), atomic layer epitaxy (ALE), chemical beam epitaxy (CBE), or metal-organic chemical vapor deposition (MOCVD), or suitable combinations thereof. According to various embodiments, the deposition process may be performed using a lower temperature (LT) process as described in connection with FIG. 1. For example, in one embodiment, the regrown structure 110 may include GaN deposited by epitaxial deposition at a temperature ranging between 350° C.-500° C. According to various embodiments, the regrown structure 110 may have a thickness that is less than or equal to 200 angstroms. For example, the regrown structure 110 may have a thickness that ranges from 25 angstroms to 200 angstroms in a direction that is substantially perpendicular to a surface of the buffer layer 104 upon which the barrier layer 106 is formed. Other thicknesses and types of materials can be used for the regrown structure 110 in other embodiments.

In some embodiments, material that is deposited to form the regrown structure 110 may be deposited as a capping layer 610 on the dielectric layer 116 during a deposition process that is used to form the regrown structure 110. In some embodiments, one or both of the dielectric layer 116 and the capping layer 610 may be removed prior to forming the gate such that the dielectric layer 116 and/or the capping layer 610 may not be present in a final IC device product that is shipped to a customer.

Figure 8:
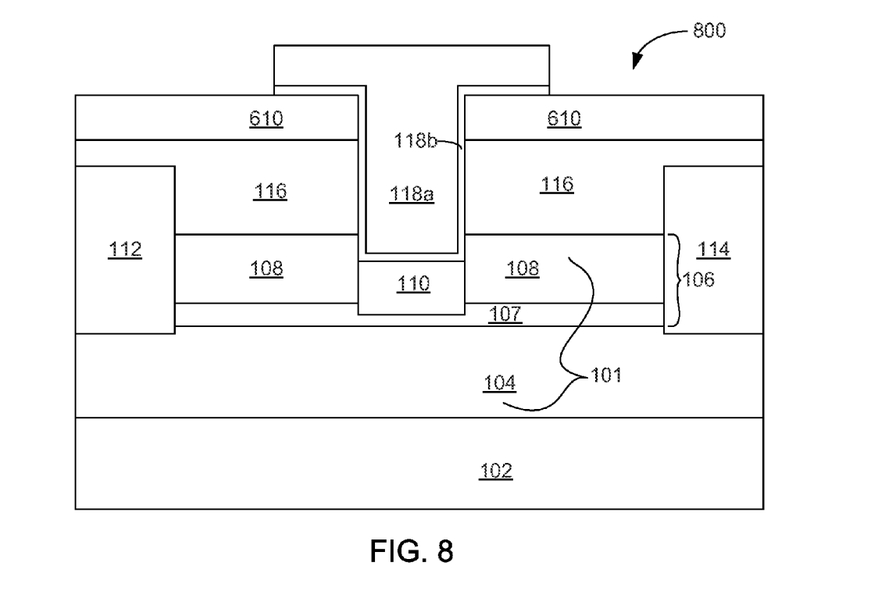
FIG. 8 schematically illustrates a cross-section view of an IC device subsequent to formation of a gate terminal, according to various embodiments.

FIG. 8 schematically illustrates a cross-section view of an integrated circuit (IC) device 800 subsequent to formation of a gate (e.g., gate 118 of FIG. 1), according to various embodiments. The gate may include a gate electrode 118a and, in some embodiments, a gate insulator film 118b.

In some embodiments, a dielectric or electrically insulative material may be deposited to form a gate insulator film 118b. The material of the gate insulator film 118b may, for example, be composed of silicon nitride (SiN), silicon oxide ($SiO_2$), aluminum oxide ($Al_2O_3$), and/or hafnium oxide ($HfO_2$). Other techniques or materials may be used to form the gate insulator film 118b in other embodiments. In some embodiments, the gate insulator film 118b may not be used at all.

The gate electrode 118a may be formed by depositing an electrically conductive material into the gate recess opening (e.g., gate recess opening 117 of FIG. 6). In embodiments where a gate insulator film 118b is used, the gate electrode 118a may be deposited on the gate insulator film 118b. In embodiments, where a gate insulator film 118b is not used, the gate electrode 118a may be deposited on the regrown structure 110 and surfaces of the barrier layer 106, as can be seen. The electrically conductive material may be deposited by any suitable deposition process including, for example, evaporation, atomic layer deposition (ALD) and/or chemical vapor deposition (CVD).

Figure 9:
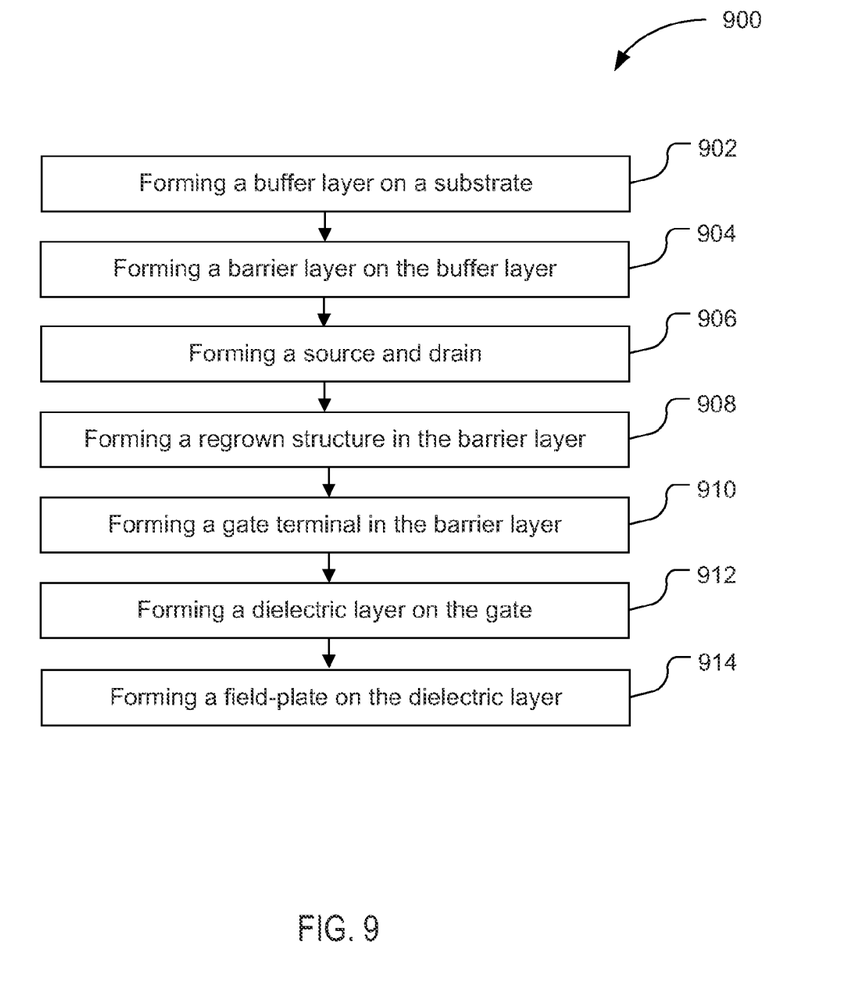
FIG. 9 is a flow diagram of a method for fabricating an IC device, according to various embodiments.

FIG. 9 is a flow diagram of a method 900 for fabricating an integrated circuit device (e.g., the IC device 100 or 200 of FIGS. 1-2), according to various embodiments. The method may comport with techniques and configurations described in connection with FIGS. 1-8.

At 902, the method 900 includes forming a buffer layer (e.g., buffer layer 104 of FIG. 1) on a substrate (e.g., substrate 102 of FIG. 1). Forming the buffer layer may include epitaxially depositing a buffer layer material on the substrate. The buffer layer may be composed of multiple layers in some embodiments.

At 904, the method 900 may further include forming a barrier layer (e.g., barrier layer 106 of FIG. 1) on the buffer layer (e.g., buffer layer 104 of FIG. 1). Forming the barrier layer may include epitaxially depositing a barrier layer material on the buffer layer. The barrier layer may be composed multiple layers (e.g., first barrier layer 107 of FIG. 2 and second barrier layer 108 of FIG. 2) in some embodiments. In other embodiments, the barrier layer may be formed by depositing a single layer of material.

At 906, the method 900 may further include forming a source (e.g., source 112 of FIG. 1) and drain (e.g., drain 114 of FIG. 1). The source and drain may be coupled with the barrier layer and may extend through the barrier layer into the buffer layer in some embodiments.

At 908, the method 900 may further include forming a regrown structure (e.g., regrown structure 110 of FIG. 1) in the barrier layer. In some embodiments, forming the regrown structure may include removing material of the barrier layer to form an opening (e.g., gate recess opening 117 of FIG. 6)

in the barrier layer and depositing a regrown structure material into the opening. The regrown structure may be deposited by an epitaxial deposition process in some embodiments. In some embodiments, depositing the regrown structure material includes depositing a thickness of the regrown structure material that is less than or equal to 200 angstroms.

At 910, the method 900 may further include forming a gate terminal (e.g., gate 118 of FIG. 1) in the barrier layer. In some embodiments, forming the gate terminal includes depositing a gate insulator film (e.g., gate insulator film 118b of FIG. 8) on the regrown structure in the opening in the barrier layer. In some embodiments, forming the gate terminal includes depositing a gate electrode material on the gate insulator film, or in embodiments where the gate insulator film is not deposited, depositing the gate electrode material on the regrown structure in the opening in the barrier layer. The gate electrode may be coupled with material of the barrier layer to form a Schottky junction or a MIS junction. According to various embodiments, removing the material of the barrier layer to form the opening in the barrier layer may be part of forming the regrown structure in the barrier layer at 908 and also part of forming the gate terminal in the barrier layer at 910. The material of the barrier layer may be removed by an etch process to form the opening.

At 912, the method 900 may further include forming a dielectric layer (e.g., dielectric layer 116 and/or 122 of FIG. 1) on the gate. The dielectric layer may be deposited by any suitable deposition process. According to various embodiments, the dielectric layer may serve as a passivation layer for the IC device.

At 914, the method 900 may further include forming a field-plate on the dielectric layer. The field-plate may be formed by depositing an electrically conductive material on the dielectric layer using any suitable deposition technique. Patterning processes such as lithography and/or etch processes can be used to selectively remove portions of the deposited electrically conductive material to form the field-plate. Other suitable techniques may be used in other embodiments.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 10:
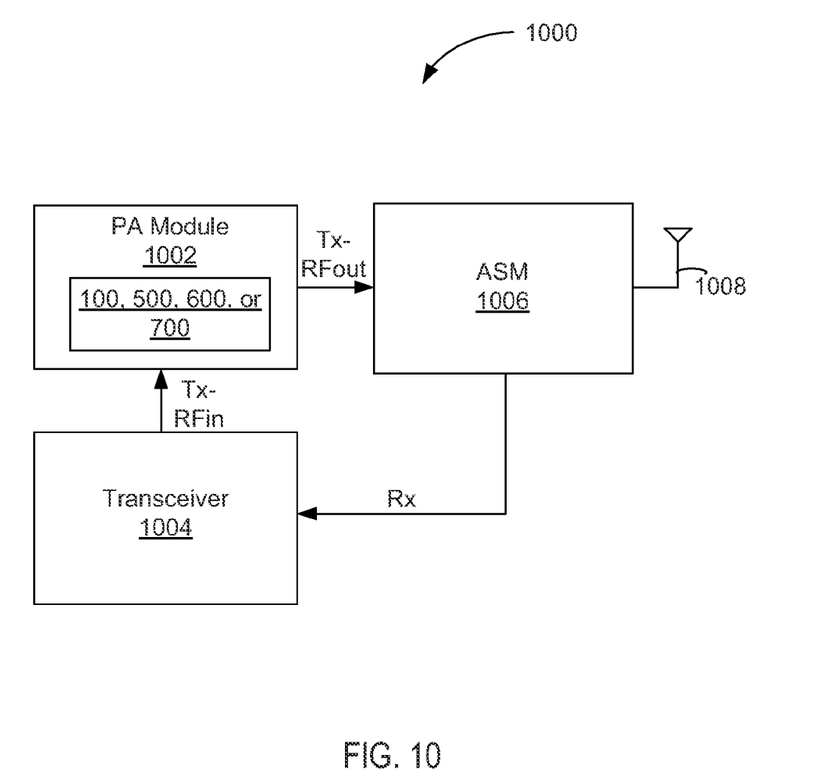
FIG. 10 schematically illustrates an example system including an IC device, according to various embodiments.

Embodiments of an IC device (e.g., the IC device 100, 200, 800 of FIGS. 1, 2, 8) described herein, and apparatuses including such IC device may be incorporated into various other apparatuses and systems. A block diagram of an example system 1000 is illustrated in FIG. 10. As illustrated, the system 1000 includes a power amplifier (PA) module 1002, which may be a Radio Frequency (RF) PA module in some embodiments. The system 1000 may include a transceiver 1004 coupled with the power amplifier module 1002 as illustrated. The power amplifier module 1002 may include an IC device (e.g., the IC device 100, 200, 800 of FIGS. 1, 2, 8) described herein.

The power amplifier module 1002 may receive an RF input signal, RFin, from the transceiver 1004. The power amplifier module 1002 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 10.

The amplified RF output signal, RFout, may be provided to an antenna switch module (ASM) 1006, which effectuates an over-the-air (OTA) transmission of the RF output signal, RFout, via an antenna structure 1008. The ASM 1006 may also receive RF signals via the antenna structure 1008 and couple the received RF signals, Rx, to the transceiver 1004 along a receive chain.

In various embodiments, the antenna structure 1008 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 1000 may be any system including power amplification. The IC device e.g., the IC device 100, 200, 800 of FIGS. 1, 2, 8) may provide an effective switch device for power-switch applications including power conditioning applications such as, for example, Alternating Current (AC)-Direct Current (DC) converters, DC-DC converters, DC-AC converters, and the like. In various embodiments, the system 1000 may be particularly useful for power amplification at high radio frequency power and frequency. For example, the system 1000 may be suitable for any one or more of terrestrial and satellite communications, radar systems, and possibly in various industrial and medical applications. More specifically, in various embodiments, the system 1000 may be a selected one of a radar device, a satellite communication device, a mobile handset, a cellular telephone base station, a broadcast radio, or a television amplifier system.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
   a buffer layer disposed on a substrate, the buffer layer including gallium (Ga) and nitrogen (N);
   a barrier layer disposed on the buffer layer, the barrier layer including aluminum (Al) and nitrogen (N);
   a resistive regrown structure disposed in and epitaxially coupled with the barrier layer, the resistive regrown structure including nitrogen (N) and at least one of aluminum (Al) or gallium (Ga) and being epitaxially deposited at a temperature less than or equal to 600° C. such that material of the resistive regrown structure is substantially polycrystalline or amorphous; and
   a gate terminal disposed in the barrier layer, wherein the resistive regrown structure is disposed between the gate terminal and the buffer layer to provide an insulating layer between the buffer layer and the gate terminal.

2. The apparatus of claim 1, wherein the resistive regrown structure includes gallium nitride (GaN), aluminum nitride (AlN), indium gallium nitride (InGaN), indium aluminum nitride (InAlN), aluminum gallium nitride (AlGaN), or indium gallium aluminum nitride (InGaAlN).

3. The apparatus of claim 1, wherein:
the barrier layer is composed of multiple layers including a first layer and a second layer;
the first layer is epitaxially coupled with the buffer layer and includes aluminum nitride (AlN);
the second layer is epitaxially coupled with the first layer and includes indium aluminum nitride (InAlN), aluminum gallium nitride (AlGaN), or indium gallium aluminum nitride (InGaAlN); and
the resistive regrown structure is in direct physical contact with the first layer and the second layer.

4. The apparatus of claim 1, wherein the barrier layer is composed of a single layer of aluminum gallium nitride (AlGaN).

5. The apparatus of claim 1, wherein a thickness of the barrier layer between the resistive regrown structure and the buffer layer is in a range of 10 angstroms to 50 angstroms.

6. The apparatus of claim 1, wherein:
the resistive regrown structure has a bandgap energy that is greater than or equal to 5 electron volts (eV).

7. The apparatus of claim 6, wherein:
the bandgap energy of the resistive regrown structure is a first bandgap energy;
the barrier layer has a second bandgap energy that is less than the first bandgap energy; and
the buffer layer has a third bandgap energy that is less than the second bandgap energy.

8. The apparatus of claim 1, wherein the resistive regrown structure has a thickness that is less than or equal to 200 angstroms.

9. The apparatus of claim 1, wherein:
the resistive regrown structure has a work function that inhibits formation of a two-dimensional electron gas (2DEG) at a gate region disposed between the gate terminal and the buffer layer; and
the gate terminal is configured to control switching of an Enhancement mode (E-mode) high electron mobility transistor (HEMT) device.

10. The apparatus of claim 1, wherein the gate terminal is coupled with material of the barrier layer to form a Schottky junction or a metal-insulator-semiconductor (MIS) junction.

11. The apparatus of claim 1, further comprising:
a source coupled with the barrier layer; and
a drain coupled with the barrier layer, wherein the source and the drain extend through the barrier layer into the buffer layer.

12. The apparatus of claim 11, further comprising:
a dielectric material disposed on the barrier layer, the dielectric material encapsulating a portion of the gate terminal.

13. The apparatus of claim 12, wherein:
the gate terminal is a T-shaped field-plate gate; and
the gate terminal includes nickel (Ni), platinum (Pt), iridium (Ir), molybdenum (Mo), or gold (Au).

14. The apparatus of claim 13, further comprising:
a field-plate disposed on the dielectric material, the field-plate being electrically coupled with the source and capacitively coupled with the gate terminal through the dielectric material.

15. The apparatus of claim 1, further comprising:
the substrate, the substrate including silicon (Si), silicon carbide (SiC), sapphire ($Al_2O_3$), gallium nitride (GaN), or aluminum nitride (AlN).

16. The apparatus of claim 1, wherein the resistive regrown structure is configured to increase a sheet resistivity of the barrier layer.

17. The apparatus of claim 9, wherein the resistive regrown structure is configured to increase a sheet resistivity of the gate region.

* * * * *